United States Patent
Chien et al.

(10) Patent No.: US 9,140,987 B2
(45) Date of Patent: Sep. 22, 2015

(54) METHOD FOR LITHOGRAPHY PATTERNING

(71) Applicant: Taiwan Semiconductor Manufacturing Company, Ltd., Hsin-Chu (TW)

(72) Inventors: Shang-Chieh Chien, New Taipei (TW);
Shu-Hao Chang, Taipei (TW);
Hsiang-Yu Chou, Taipei (TW);
Ming-Chin Chien, Hsinchu (TW);
Jui-Ching Wu, Hsinchu (TW);
Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/186,818

(22) Filed: Feb. 21, 2014

(65) Prior Publication Data
US 2015/0241776 A1    Aug. 27, 2015

(51) Int. Cl.
G03F 7/26 (2006.01)
G03F 7/09 (2006.01)
G03F 7/20 (2006.01)
G03F 7/30 (2006.01)
H01L 21/308 (2006.01)

(52) U.S. Cl.
CPC ............. *G03F 7/09* (2013.01); *G03F 7/2002* (2013.01); *G03F 7/2037* (2013.01); *G03F 7/2039* (2013.01); *G03F 7/30* (2013.01); *H01L 21/3086* (2013.01)

(58) Field of Classification Search
CPC ............. G03F 7/11; G03F 7/091; G03F 7/40; G03F 7/094; G03F 7/095; G03F 7/004; G03F 7/0392; G03F 7/00; H01L 21/00; H01L 21/0273; H01L 21/31116; H01L 21/0271; H01L 21/31138; H01L 21/31144; C09D 161/06
USPC ............................... 430/270.1, 322
See application file for complete search history.

(56) References Cited

U.S. PATENT DOCUMENTS

2011/0230058 A1    9/2011    Sakamoto et al.
2013/0323641 A1    12/2013    Chang

OTHER PUBLICATIONS

Julius Joseph Santillan et al., "EUV Resist Outgassing Analysis in Selete," Proc. of SPIE vol. 6923, 692342, (2008), 9 pages, Advances in Resist Materials and Processing Technology XXV.
Hao Xu et al., "Underlayer Designs to Enhance the Performance of EUV Resists," Proc. of SPIE vol. 7273, 72731J, (2009), 11 pages, Advances in Resist Materials and Processing Technology XXVI.

*Primary Examiner* — Caleen Sullivan
(74) *Attorney, Agent, or Firm* — Haynes and Boone, LLP

(57) ABSTRACT

A method of reducing resist outgassing for EUV lithography is disclosed. The method includes forming a material layer over a substrate wherein a top surface of the material layer contains a certain concentration of a quencher or a base. The method further includes forming a resist layer over the top surface of the material layer and exposing the resist layer to a EUV radiation for patterning. The quencher or the base underneath the resist layer acts to suppress resist outgassing during the EUV exposure. The material layer itself may serve as a hard mask layer or an anti-reflection layer for the patterning process, in addition to being the carrier of the quencher or the base. The method can be used in other types of lithography, such as e-beam lithography, for reducing resist outgassing.

20 Claims, 10 Drawing Sheets

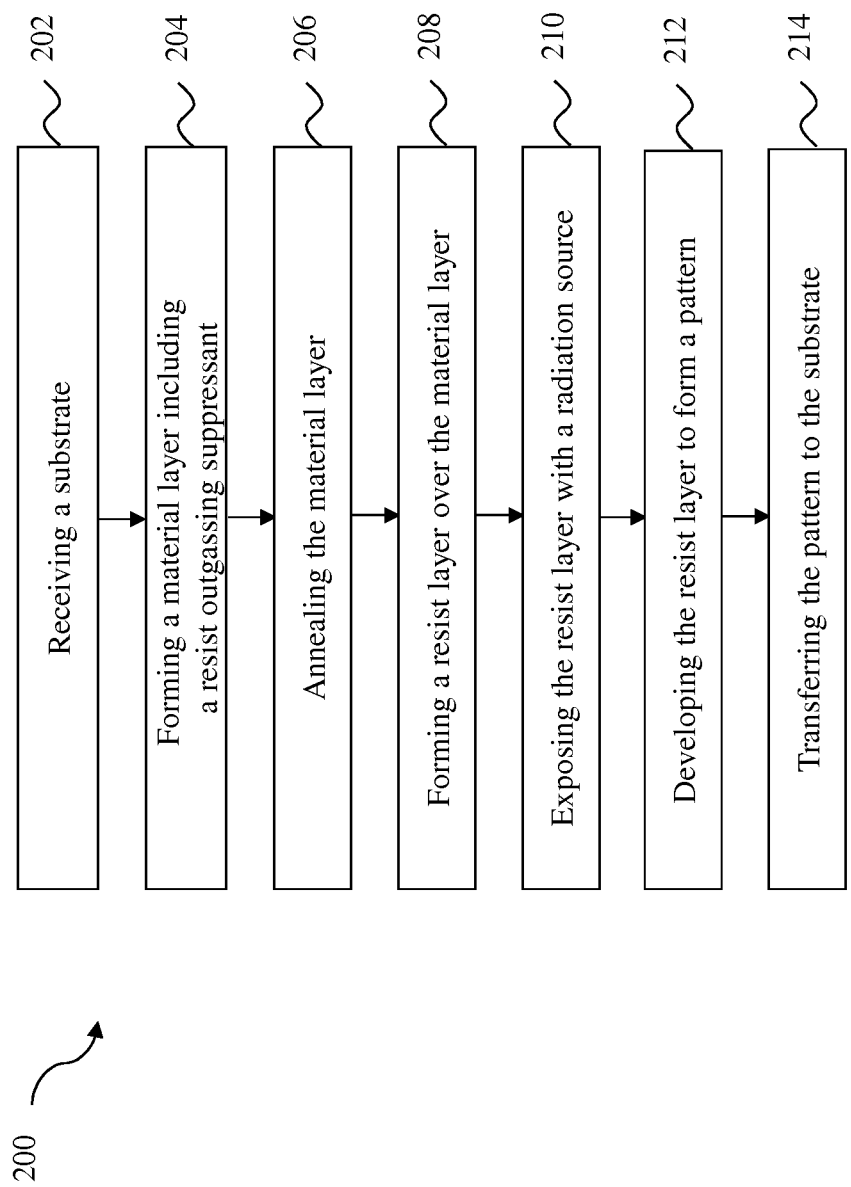

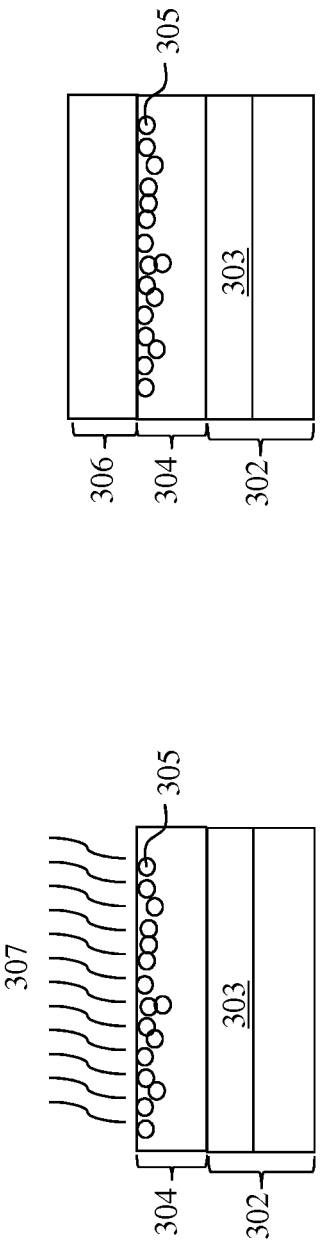

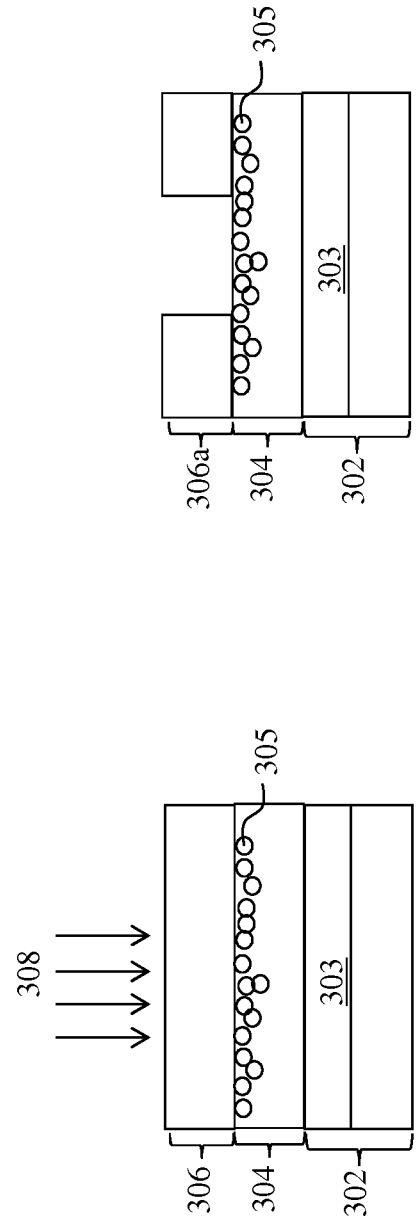

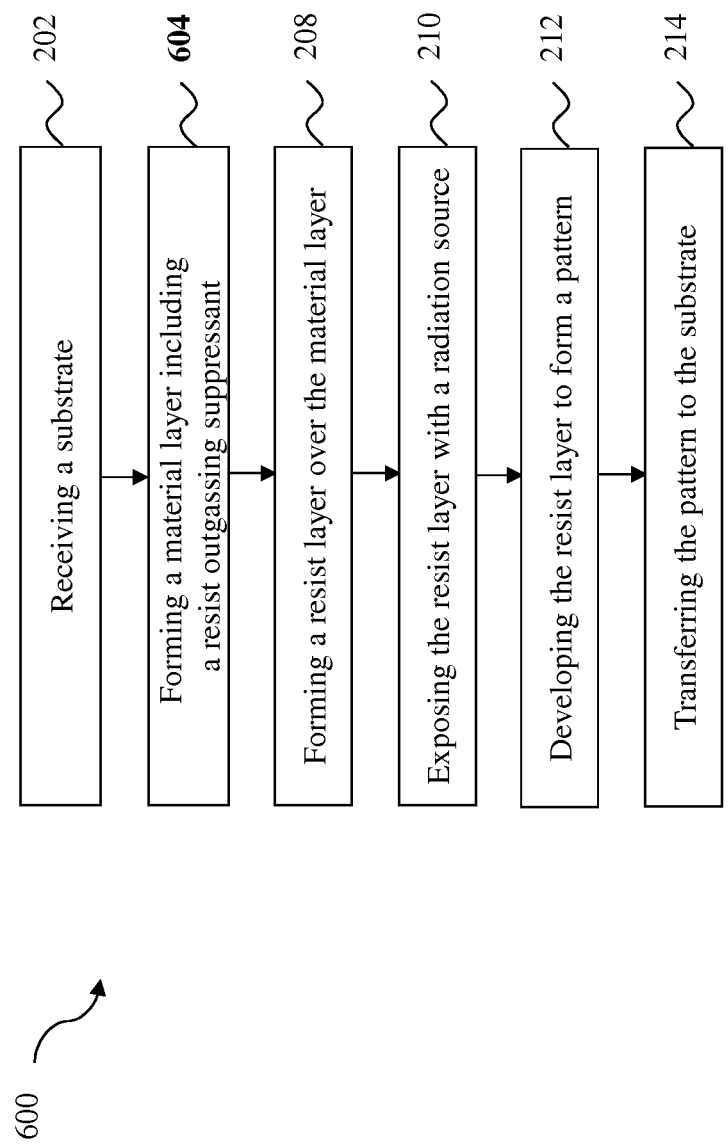

METHOD FOR LITHOGRAPHY PATTERNING

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography patterning processes grows.

Techniques such as extreme ultraviolet (EUV) lithography have been utilized to support high resolution requirements of nano-scale semiconductor devices. EUV lithography uses radiation in the EUV region, such as 13.5 nanometer (nm). Typically, EUV lithography is performed in a vacuum. The vacuum environment can produce related difficulties. For example, resist material used in EUV lithography is known to outgas during exposure, which may contaminate EUV optics, such as projection mirrors, in the same environment. Improvements are desired in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 illustrates a flow chart of a lithography patterning method according to various aspects of the present disclosure.

FIGS. 3A-3H illustrate cross sectional views of forming a target pattern according to the method of FIG. 2, in accordance with an embodiment.

FIG. 6 illustrates another flow chart of a lithography patterning method according to various aspects of the present disclosure.

DETAILED DESCRIPTION

Figure 1:
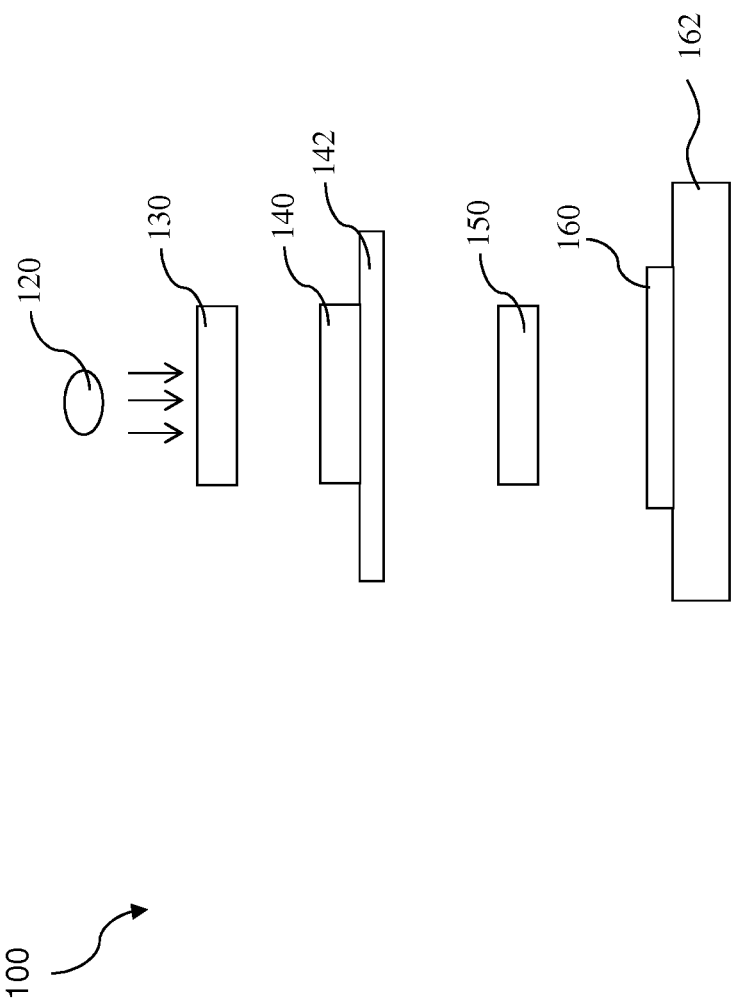
FIG. 1 is a block diagram of a lithography system that may benefit from one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a lithography system 100 that may benefit from one or more embodiments of the provided subject matter is disclosed. For the sake of example, the following discussion will refer to an extreme ultraviolet (EUV) lithography for exposing a wafer on which one or more semiconductor devices are to be fabricated. However, the inventive scope of the present disclosure is not limited to EUV lithography and one of ordinary skill in the art may apply the teachings in the present disclosure to other types of lithography process, such as electron beam (e-beam) lithography, x-ray lithography, etc. The EUV lithography system 100 employs an EUV radiation source 120 having a wavelength of about 1-100 nm, including an EUV wavelength of about 13.5 nm.

The EUV lithography system 100 also employs an illuminator 130. The illuminator 130 may comprise refractive optics, such as a single lens or a lens system having multiple lenses (zone plates) and/or reflective optics, such as a single mirror or a mirror system having multiple mirrors, in order to direct light from the radiation source 120 onto a mask 140. In the EUV wavelength range, reflective optics is generally employed. Refractive optics, however, can also be realized by zoneplates. In the present embodiment, the illuminator 130 is set up to provide an on-axis illumination to illuminate a mask 140. In on-axis illumination, most of all incoming light rays incident on the mask 140 are at the same angle of incidence (AOI), e.g., AOI=6°, as that of a chief ray. In many situations, there may be some angular spread of the incident light. For example, the EUV lithography system 100 may utilize disk illumination (i.e., illumination on a pupil plane is shaped like a disk centered at the pupil center). Partial coherence σ can also be used to describe a point source which produces a plane wave for illuminating the mask 140. In the present embodiment, it is sufficient to employ a nearly on-axis illumination having point sources with σ less than 0.3.

The mask 140 is a reflective mask in that some portions of its top surface reflect radiation projected thereon in forming an aerial image of IC patterns to be printed on a target 160, such as a wafer. The mask 140 is also referred to as a photomask or a reticle. The mask 140 may incorporate resolution enhancement techniques such as phase-shifting mask (PSM) and/or optical proximity correction (OPC). The mask 140 is typically secured on a mask stage 142 which provides accurate position and movement of the mask 140 during alignment, focus, leveling and exposure operation in the EUV lithography process 100.

The EUV lithography system and process 100 also employs optics 150. The optics 150 may have refractive optics or reflective optics. The radiation reflected from the mask 140 (e.g., a patterned radiation) is collected by the optics 150 and is then projected on to the target 160.

The target 160 includes a substrate (e.g., a semiconductor wafer) with a photosensitive layer (e.g., a photoresist or resist) formed thereon. The target 160 may be held by a target substrate stage 162 that provides control of the target substrate position such that the image of the mask 140 is scanned onto the substrate in a repetitive fashion (though other lithography methods are possible). The resist layer is sensitive to the EUV radiation. One resist material is chemically amplified resist (CAR) that contains backbone polymer protected by acid labile groups (ALGs). CAR further contains photoacid generators (PAGs) which, upon radiation, produce an acid. The acid can catalyze the cleaving of the ALGs from the backbone polymer, though often requiring that the resist-coated substrate be heated (such as in a post exposure bake (PEB) process). This cleaving reaction is catalytic, in the sense that the acid still remains after the reaction, and is therefore available to promote the cleaving of additional ALGs. Such a cleaving reaction will be terminated only when the acid produced comes in contact with a base, also referred to as a base quencher. When the ALGs leave the backbone polymer, the branch unit of the polymer will be changed to carboxylic group that increases the polymer's solubility to a positive tone developer; thus, allowing the irradiated area of the resist to be removed by a developer, while the non-irradiated area remains insoluble and becomes a masking element for subsequent processes. Other components of the resist material may also or alternatively be present including photo base generator (PBG), photo decompose quencher (PDQ), dyes, wetting agents, coating aids, amines, adhesion promoters, and/or other suitable components.

After the target 160 is exposed to the EUV radiation, it is moved to a developer where areas of the resist layer are removed thereby transferring the patterns from the mask 140 to the target 160.

With the EUV lithography system 100, the exposure process generally takes place in vacuum because EUV radiation does not propagate in air. At the same time, resist is known to outgas due to the high energy radiation and the photonic and/or chemical reactions within the resist. For example, the PAGs decompose into photoacid and another material that may be volatile to outgas from the resist. For example, S atoms, benzene, Diphenyl Sulfide, CO2-, CO—, H2O, Methyl-, may potentially be produced during the EUV radiation. The outgassed compounds may contaminate the various components of the EUV lithography system 100, such as the optics 150. Such contamination degrades the performance (e.g. throughput or process window) of the EUV lithography system 100. Therefore, it is desirable to reduce or eliminate resist outgassing. One method of reducing resist outgassing is to increase the concentration level of the quencher in the resist. However, a high concentration of the quencher in the resist may slow down the photo acid production therefore reducing the throughput of the EUV lithography system 100. In some situation, too much quencher in the resist may even prevent proper patterning of the resist. Another method of avoiding contamination by resist outgassing is to employ a flow of inert gas at a low partial pressure, between the optics 150 and the target 160. Contaminants will be carried along by the flow of inert gas, reducing contamination of the optics 150. However, such method may be costly due to new tool development and deployment.

FIG. 2 is a flow chart of a method 200 of exposing and patterning a semiconductor wafer according to various aspects of the present disclosure. The method 200 may be implemented, in whole or in part, by a EUV lithography system, such as the EUV lithography system 100, to reduce or eliminate resist outgassing. Additional operations can be provided before, during, and after the method 200, and some operations described can be replaced, eliminated, or moved around for additional embodiments of the method. The method 200 is an example, and is not intended to limit the present disclosure beyond what is explicitly recited in the claims. The method 200 is described below in conjunction with FIGS. 3A-3H.

The method 200 (FIG. 2) receives a substrate 302 (FIG. 3A) at operation 202. Referring to FIG. 3A, the substrate 302 includes one or more layers of material or composition. In the present embodiment, the substrate 302 includes a pattern layer 303. In an embodiment, the substrate 302 is a semiconductor substrate (e.g., wafer). In an embodiment, the substrate 302 includes silicon in a crystalline structure. In alternative embodiments, the substrate 302 includes other elementary semiconductors such as germanium, or a compound semiconductor such as silicon carbide, gallium arsenide, indium arsenide, and indium phosphide. The substrate 302 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

Figure 3B:
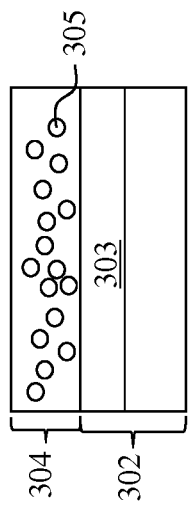
Figure 3A:
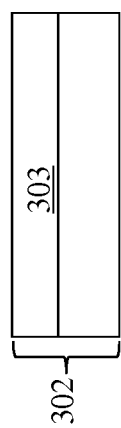

The method 200 (FIG. 2) proceeds to operation 204 by forming a material layer 304 over the substrate 302 (FIG. 3B). Referring to FIG. 3B, in an embodiment, the material layer 304 is an anti-reflection layer such as a nitrogen-free anti-reflection coating (NFARC) layer for benefitting a subsequent radiation exposure process. In an embodiment, the NFARC layer 304 includes a material such as silicon oxide, silicon oxygen carbide, or plasma enhanced chemical vapor deposited silicon oxide. In another embodiment, the material layer 304 may include a bottom anti-reflection coating polymeric material, a silicon containing polymer, or other suitable material. In another embodiment, the material layer 304 is a hard mask layer for a subsequent etching process. In an embodiment, the hard mask layer 304 uses amorphous silicon (a-Si), silicon oxide, silicon nitride (SiN), titanium nitride, or other suitable material or composition.

In the present disclosure, the material layer 304 further includes a resist outgassing suppressant (ROS) 305. In an embodiment, the ROS 305 is a quencher commonly used in a resist. As discussed above, a quencher in a resist is known to suppress resist outgassing. In an embodiment, the ROS 305 is a basic quencher to be used in conjunction with a resist that contains PAGs. In another embodiment, the ROS 305 is an acidic quencher to be used in conjunction with a resist that contains PBGs. In an embodiment, the ROS 305 is a base.

In an embodiment, the ROS 305 is a quencher having a formula as shown below:

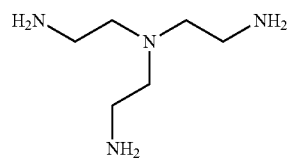

For example, in an embodiment, the ROS 305 is a quencher having the formula: $NR_3$, where R includes an alkyl functional structure having at least one carbon atom. In an embodiment, at least one of the R groups includes a —CH₃ group. In an embodiment, each of the R groups may further include one or more chemical groups selected from the —Cl; —Br; —I; —NO₂; —SO₃—; —H—; —CN; —NCO, —OCN; —CO₂—; —OH; —OR*, —OC(O)CR*; —SR, —SO2N(R*)₂; —SO₂R*; SOR; —OC(O)R*; —C(O)OR*; —C(O)R*; —Si(OR*)₃; —Si(R*)₃; and/or epoxyl groups. R* may be H, an unbranched or branched, cyclic or noncyclic, saturated or unsaturated alkyl or alkenyl or alkynyl groups. One exemplary quencher is Triethylamine.

More exemplary quencher materials are provided in U.S. Patent Publication No. 2013/0323641, which is hereby incorporated by reference. The above listed quencher materials are exemplary and do not limit the scope of the present disclosure.

In an embodiment, the ROS 305 includes a base material, such as hydroxides of alkali metals and alkaline earth metals like NaOH, Ca(OH)₂, KOH, Ba(OH)₂, CsOH, or other superbases like Sodium Amide (NaNH₂) and Sodium hydride (NaH).

In an embodiment, the ROS 305 and the material 304 are mixed in a solvent and the solution is coated on the substrate 302 using a process such as a spin coating process. A concentration level of the ROS 305 in the material layer 304 is controlled so as to achieve the purpose of suppressing resist outgassing at a later exposure step. On the one hand, too low a concentration may not reduce the resist outgassing down to a desired level. On the other hand, too high a concentration may affect the patterning of a resist layer subsequently formed thereon, or may affect the functionality of the material layer 304, such as anti-reflectivity or etch selectivity. In an embodiment, the concentration level of the ROS 305 in the material layer 304 is configured to be in a range from about 5% by mass (or weight) to about 80% by mass (or weight).

In an embodiment, the mixture of the material 304 and the ROS 305 is deposited over the substrate 302, using a technique such as a deposition method based on evaporation deposition, chemical vapor deposition (CVD), atomic layer deposition (ALD), and/or physical vapor deposition (PVD).

The method 200 (FIG. 2) proceeds to operation 206 to perform an annealing process 307 to the material layer 304. Referring to FIG. 3C, the annealing process 307 causes the ROS 305 to migrate to a top surface of the material layer 304, away from the substrate 302. In an embodiment, the annealing process 307 also serves to drive out solvents in the material layer 304. In an embodiment, the annealing process 307 includes heating the substrate 302 and the material layer 304 to about 200 degree Celsius for about 60 seconds.

The method 200 (FIG. 2) proceeds to operation 208 by forming a resist layer 306 on the top surface of the material layer 304. Referring to FIG. 3D, in an embodiment, a portion of the resist layer 306 is in direct contact with the ROS 305. The resist layer 306 may use a CAR that includes PAGs (if the ROS 305 is basic quencher) or PBGs (if the ROS 305 is an acidic quencher). Various types of resist material and/or composition may be used in forming the resist layer 306. In an embodiment, the resist layer 306 does not contain a quencher material therein. In another embodiment, the resist layer 306 may contain some quencher material whose concentration level is lower than that of the ROS 305 in the material layer 304. For example, the resist layer 306 may contain a quencher about 3% or less by weight. The forming of the resist layer 306 may include a spin coating process, a soft bake process, a hard bake process, etc.

The method 200 (FIG. 2) proceeds to operation 210 by exposing the resist layer 306 to a radiation 308 in a lithography system, such as the EUV lithography system 100. Referring to FIG. 3E, the radiation 308 may be a deep ultraviolet (DUV) radiation, a EUV radiation, an electron beam (e-beam), an x-ray, an ion beam, or other suitable radiation. In an embodiment, the radiation 308 is a EUV radiation with a wavelength 13.8 nm. In an embodiment, the resist 306 is a positive resist and the irradiated portion of the resist layer 306 will become soluble in a developer. In another embodiment, the resist 306 is a negative resist and the irradiated portion of the resist layer 306 will become insoluble in a developer. Lithography processes used to pattern the resist layer 306 include immersion lithography, photolithography, optical lithography and/or other patterning methods which may transfer a pattern onto the resist layer 306. In the present embodiment, the ROS 305 at the material layer 304 acts to suppress outgassing from the resist layer 306 at the operation 210.

The method 200 (FIG. 2) proceeds to operation 212 by developing the resist layer 306 in a developer where areas of the resist layer 306 are removed thereby forming a patterned resist layer 306a (FIG. 3F). In some embodiments, a developer includes a water based developer, such as tetramethylammonium hydroxide (TMAH), for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying a developer on the exposed resist layer 306, for example, by a spin-on process. Applying a developer also includes using a post exposure bake (PEB) process, a post develop bake (PDB) process, or a combination thereof. The developed or patterned resist layer 306a is used for further processing the semiconductor wafer in order to form the target IC device. For example, one or more layers of the substrate 302 may be etched with the patterned resist layer 306a as an etch mask.

The method 200 (FIG. 2) proceeds to operation 214 by transferring the pattern from the patterned resist layer 306a to the substrate 302, as described below.

Figure 3H:
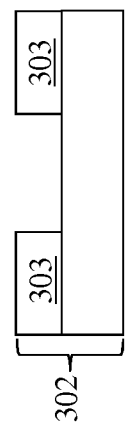
Figure 3G:
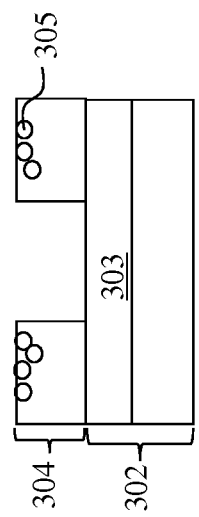

In an embodiment, the material layer 304 is a hard mask layer, in addition to being the carrier of the ROS 305. The pattern is first transferred from the patterned resist layer 306a to the material layer 304, then to the substrate 302. For example, the material layer 304 may be etched through openings of the patterned resist layer 306a using a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The patterned resist layer 306a may be partially or completely consumed during the etching of the material layer 304. In an embodiment, any remaining portion of the patterned resist layer 306a may be stripped off, leaving a patterned material layer 304 over the substrate 302, as illustrated in FIG. 3G. The presence of the ROS 305 at the top portion of the material layer 304 does not affect the etching profile of the pattern. Thereafter, operation 214 proceeds to transferring the pattern from the patterned material layer 304 to the substrate 302, for example, by etching the pattern layer 303 of the substrate 302 and removing the patterned material layer 304 thereafter (FIG. 3H).

In another embodiment, the material layer 304 is a layer of anti-reflection coating and the patterned resist layer 306a serves as an etch mask for etching the pattern layer 303 of the substrate 302 through the material layer 304. After the pattern layer 303 has been etched, any remaining portion of the patterned resist layer 306a and/or the material layer 304 is removed (FIG. 3H).

Although not shown in FIG. 2, the method 200 may proceed to forming a final pattern or an IC device or structure on the substrate 302. In an embodiment, a target pattern is to be formed as metal lines in a multilayer interconnection structure. For example, the metal lines may be formed in an interlayer dielectric (ILD) layer of the substrate 302, which has been etched by operation 214 to include a plurality of trenches. The method 200 proceeds to filling the trenches with a conductive material, such as a metal; and polishing the conductive material using a process such as chemical mechanical polishing (CMP) to expose the patterned ILD layer, thereby forming the metal lines in the ILD layer.

In another embodiment, the substrate 302 is a semiconductor substrate and the method 200 proceeds to forming fin field effect transistor (FinFET) structures. In this embodiment, operation 214 forms a plurality of trenches in the semiconductor substrate 302. Shallow trench isolation (STI) features are further formed in the trenches by a procedure that includes deposition to fill the trenches with a dielectric material and polishing (such as CMP) to remove excessive dielectric material and to planarize the top surface of the semiconductor substrate. Thereafter, a selective etch process is applied to the dielectric material to recess the STI features, thereby forming fin-like active regions.

Figure 4:
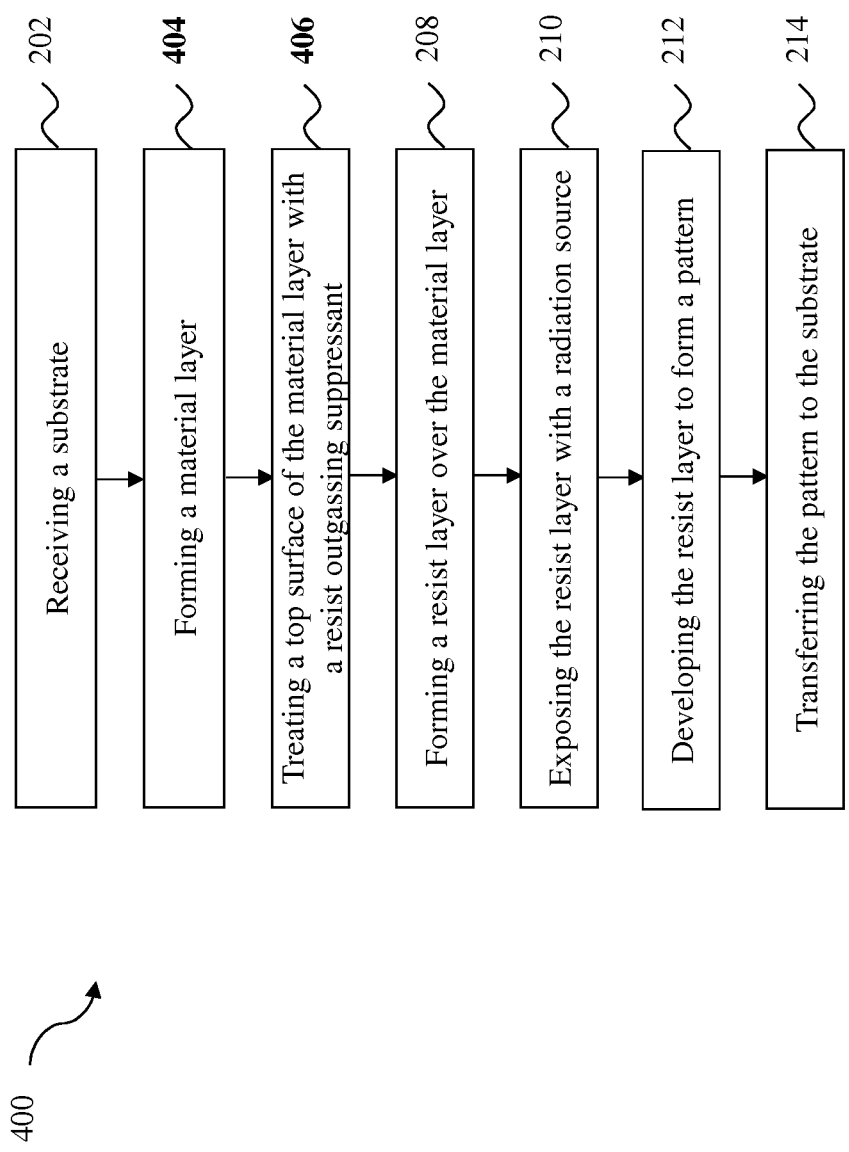
FIG. 4 illustrates another flow chart of a lithography patterning method according to various aspects of the present disclosure.

FIGS. 4 and 6 show flow charts of a method 400 and a method 600, respectively, of patterning a substrate using lithography according to various aspects of the present disclosure. Various steps of the methods 400 and 600 may be similar to those of the method 200, and therefore are not repeated for the purpose of simplicity. Instead, they are shown with repeated reference numerals and/or letters. Additional operations can be provided before, during, and after the methods 400 and 600, and some operations described can be replaced, eliminated, or moved around for additional embodiments of the methods. The methods 400 and 600 are examples, and do not intended to limit the present disclosure beyond what is explicitly recited in the claims. The method 400 is described below in conjunction with FIGS. 5A-5B, and the method 600 is described below in conjunction with FIG. 7.

Figure 5B:
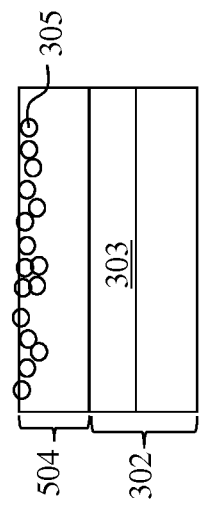
FIGS. 5A and 5B illustrate cross sectional views of forming a target pattern according to the method of FIG. 4, in accordance with an embodiment.
Figure 5A:
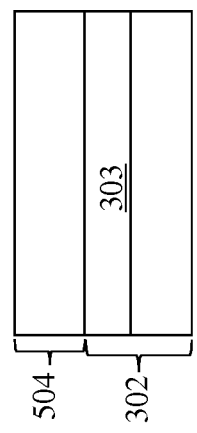

Referring to FIG. 4, after receiving a substrate at operation 202, the method 400 (FIG. 4) proceeds to operation 404 to forming a material layer 504. Referring to FIG. 5A, the material layer 504 is formed over the substrate 302. The material layer 504 may be a hard mask layer or an anti-reflection layer as discussed above with reference to FIG. 3B. In an embodiment, the material layer 504 contains silicon.

The method 400 (FIG. 4) proceeds to operation 406 to treating a top surface of the material layer 504 with an ROS, such as the ROS 305. Referring to FIG. 5B, the material layer 504 is shown to include a thin layer of the ROS 305 at its top surface away from the substrate 302. In an embodiment, a solution containing the ROS 305 is applied to the top surface by a process, such as a spin coating process, a spraying process, or other suitable process or method. Following the application, the ROS 305 diffuses into the material layer 504. Excessive solution may be removed by a cleaning process and/or a drying process subsequently. In another embodiment, the material layer 504 contains silicon-containing chains and a chemical synthesis is applied to bond quencher side group or a base-type side group to the silicon-containing chains. For example, after applying the ROS 305 molecules to the top surface of the material layer 504, the material layer 504 and the ROS 305 are heated to a certain temperature, such as a temperature between about 100 degree Celsius and about 500 degree Celsius, to break the respective chemical bonds of the silicon-containing chains and the ROS 305 and to form new chemical bonds. To promote the chemical reactions, some catalyst may be added to the mixture and another heating process may also be performed. A cleaning procedure may be subsequently performed to remove residues from the top surface of the material layer 504.

The method 400 (FIG. 4) proceeds to operation 208 to forming a resist layer, such as the resist layer 306, over the treated top surface of the material layer 504.

The method 400 (FIG. 4) proceeds to operation 210 to exposing the resist layer, during which the ROS 305 at the treated top surface of the material layer 504 acts to suppress resist outgassing.

Figure 7:
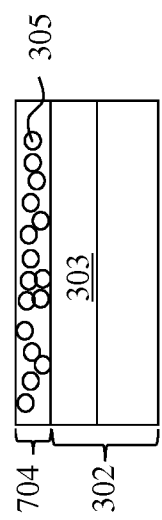
FIG. 7 illustrates cross sectional views of forming a target pattern according to the method of FIG. 6, in accordance with an embodiment.

The method 600 (FIG. 6) is described below in conjunction with FIG. 7. Referring to FIG. 6, after receiving a substrate at operation 202, the method 600 proceeds to operation 604 to forming a material layer 704 that contains an ROS, such as the ROS 305. Referring to FIG. 7, shown therein is the material layer 704 disposed over the substrate 302. The material layer 704 serves as a resist underlayer for a resist layer subsequently formed thereon. In an embodiment, the material layer 704 is formed by a spin coating process. Alternatively, the material layer 704 may be formed by a dip-coating method or an inkjet printing method. In yet another embodiment, the material layer 704 is formed by a deposition process, such as evaporation deposition, CVD, ALD, or PVD. In an embodiment, a vacuum or a nitrogen-filled environment is used when forming the material layer 704 for controlling film quality. The thickness of the material layer 704 is configured so as to provide effective resist outgassing suppression. In an embodiment, the material layer 704 is about 3 nm.

The method 600 (FIG. 6) proceeds to operation 208 to forming a resist layer, such as the resist layer 306, directly over the material layer 704.

The method 600 (FIG. 6) proceeds to operation 210 to exposing the resist layer, during which the material layer 704 acts to suppress resist outgassing.

In various embodiments of the present disclosure, a quencher or a base is incorporated into a material layer underneath a resist layer so that the quencher or the base helps reduce or eliminate resist outgassing when the resist layer is exposed. Although not intended to be limiting, one or more embodiments of the present disclosure provide many benefits to a lithography system or process, such as an EUV lithography process. One of the benefits is that many of the embodiments of the provided subject matter fit into a lithography process without adding new tools thereby saving costs. For example, a hard mask layer may have already been part of a lithography process. Therefore, forming the hard mask layer to include a quencher or a base or treating a top surface of the hard mask layer to include a quencher or a base does not represent a drastic change of the overall lithography process. Another one of the benefits is that, because many of the embodiments have the quencher-containing material layer formed underneath a resist layer, such configuration neither adversely affects the adhesion between the material layer and the resist layer, nor affects the resist layer's radiation throughput. Some embodiments of the present disclosure have been implemented to demonstrate their effectiveness of suppressing resist outgassing in EUV lithography.

In one exemplary aspect, the present disclosure is directed to a method of lithography patterning. The method includes receiving a substrate and forming a material layer over the substrate, wherein the material layer contains a first concentration of a resist outgassing suppressant (ROS) that is a first quencher or a base. The method further includes forming a resist layer over the material layer, wherein the resist layer includes a second concentration of a second quencher, and the second concentration is less than the first concentration. The method further includes exposing the resist layer to a radiation source, wherein the ROS acts to reduce outgassing from the resist layer during the exposure.

In another exemplary aspect, the present disclosure is directed to a method of integrated circuit lithography. The method includes receiving a substrate and forming a material layer over the substrate. The method further includes treating a top surface of the material layer with a resist outgassing suppressant (ROS). The method further includes forming a resist layer over the treated top surface of the material layer and patterning the resist layer using a radiation source.

In another exemplary aspect, the present disclosure is directed to a method of lithography patterning. The method includes providing a substrate and forming a resist underlayer over the substrate, wherein the resist underlayer includes a quencher or a base. The method further includes forming a resist layer over the resist underlayer and exposing the resist layer to a radiation source that has wavelength less than 100 nm, wherein the resist underlayer acts to suppress outgassing from the resist layer. The method further includes developing the resist layer to form a pattern and transferring the pattern to the substrate to form an integrated circuit.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of lithography patterning comprising:
    receiving a substrate;
    forming a material layer over the substrate, wherein the material layer includes a first concentration of a resist outgassing suppressant (ROS) that is a first quencher or a base;
    forming a resist layer over the material layer, wherein the resist layer includes a second concentration of a second quencher, and the second concentration is less than the first concentration; and
    exposing the resist layer to a radiation source,
    wherein the ROS acts to reduce outgassing from the resist layer during the exposure.

2. The method of claim 1, further comprising, before the forming the resist layer:
    annealing the material layer thereby the ROS migrates to a top surface of the material layer over which the resist layer is subsequently formed.

3. The method of claim 1, further comprising:
    developing the resist layer to form a pattern; and
    transferring the pattern to the substrate.

4. The method of claim 1, wherein the radiation source is an extreme ultraviolet (EUV) radiation.

5. The method of claim 1, wherein the radiation source is an electron beam (e-beam).

6. The method of claim 1, wherein the first concentration is about 5 percent to 80 percent by mass.

7. The method of claim 1, wherein the second concentration is about zero percent.

8. The method of claim 1, wherein the material layer is a hard mask layer, or an anti-reflection coating layer.

9. The method of claim 1, wherein the ROS is the first quencher having a formula: $NR_3$, wherein R includes an alkyl functional structure having at least one carbon atom.

10. The method of claim 1, wherein the forming the material layer uses a spin coating process, a chemical vapor deposition (CVD) process, an atomic layer deposition (ALD) process, or a physical vapor deposition (PVD) process.

11. A method of integrated circuit lithography, comprising:
    receiving a substrate;
    forming a material layer over the substrate;
    treating a top surface of the material layer with a resist outgassing suppressant (ROS);
    forming a resist layer over the treated top surface of the material layer; and
    patterning the resist layer using a radiation source.

12. The method of claim 11, wherein the ROS is a quencher or a base.

13. The method of claim 11, wherein the treating the top surface includes:
    applying a chemical synthesis to the top surface thereby bonding a portion of the ROS chemical chains to molecules of the material layer.

14. The method of claim 11, wherein the treating the top surface includes:
    applying a solution to the top surface wherein the solution contains the ROS.

15. The method of claim 11, wherein the radiation source is one of: an extreme ultraviolet (EUV) radiation, an electron beam (e-beam), or an x-ray.

16. The method of claim 11, further comprising:
    etching the substrate with the patterned resist layer as an etch mask.

17. A method of lithography patterning, comprising:
    providing a substrate;
    forming a resist underlayer over the substrate, wherein the resist underlayer includes a quencher or a base;
    forming a resist layer over the resist underlayer;
    exposing the resist layer to a radiation source that has wavelength less than 100 nm, wherein the resist underlayer acts to suppress outgassing from the resist layer;
    developing the resist layer to form a pattern; and
    transferring the pattern to the substrate to form an integrated circuit.

18. The method of claim 17, wherein the resist underlayer includes the quencher, and the quencher is acidic.

19. The method of claim 17, wherein the forming the resist underlayer includes a deposition process.

20. The method of claim 17, wherein the forming the resist underlayer includes a spin coating process.

* * * * *